(12) United States Patent
Gill et al.

(10) Patent No.: US 7,277,260 B2
(45) Date of Patent: Oct. 2, 2007

(54) MAGNETIC HEAD SPIN VALVE STRUCTURE WITH COFECU MAGNETIC LAYER AND $ZNO_x/TAO_x$ CAP LAYER

(75) Inventors: Hardayal Singh Gill, Palo Alto, CA (US); Alexander M. Zeltser, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 379 days.

(21) Appl. No.: 10/945,687

(22) Filed: Sep. 21, 2004

(65) Prior Publication Data

US 2006/0061917 A1  Mar. 23, 2006

(51) Int. Cl.
  *G11B 5/33* (2006.01)
(52) U.S. Cl. .................................. 360/324.12
(58) Field of Classification Search ........... 360/324.12, 360/320, 322, 323, 324.11; 365/173
  See application file for complete search history.

(56) References Cited

U.S. PATENT DOCUMENTS

| | | | |
|---|---|---|---|
| 5,132,859 A | 7/1992 | Andricacos et al. | 360/113 |
| 5,582,927 A | 12/1996 | Andricacos et al. | 428/694 |
| 6,396,669 B1 | 5/2002 | Gill | 360/319 |
| 6,407,004 B1 | 6/2002 | Kimura et al. | 438/720 |
| 6,411,477 B1 | 6/2002 | Gill | 360/324.12 |
| 6,480,365 B1* | 11/2002 | Gill et al. | 360/324.11 |
| 6,490,139 B1* | 12/2002 | Hayashi et al. | 360/322 |
| 6,657,828 B2 | 12/2003 | Araki et al. | 360/324.1 |
| 6,721,140 B2* | 4/2004 | Inoue et al. | 360/323 |
| 6,885,526 B2* | 4/2005 | Nishiyama et al. | 360/320 |
| 6,980,404 B2* | 12/2005 | Freitag et al. | 360/324.12 |
| 2002/0048127 A1 | 4/2002 | Fukuzawa et al. | 360/324.1 |
| 2003/0058576 A1 | 3/2003 | Honjo et al. | 360/126 |
| 2003/0161181 A1* | 8/2003 | Saito et al. | 365/173 |
| 2004/0075959 A1 | 4/2004 | Gill | 360/324.12 |
| 2004/0085688 A1 | 5/2004 | Pinarbasi | 360/324.2 |

OTHER PUBLICATIONS

IPCOM19591D: Double Magnetic Tunnel Junction with Large Spin Diffusion Length Free Layer, published Sep. 22, 2003.

* cited by examiner

*Primary Examiner*—Tianjie Chen
(74) *Attorney, Agent, or Firm*—Robert O. Guillot; Intellectual Property Law Offices

(57) ABSTRACT

A magnetic head that includes a spin valve sensor of the present invention which may be a CIP or CPP device. The sensor includes a free magnetic layer that is comprised of CoFeCu. In certain embodiments the free magnetic layer may also include a sublayer of NiFe. The CoFeCu free magnetic layer preferably includes Fe in a range of 5-20 at. % and Cu in a range of 1-10 at. %. The sensor may also include a cap layer of the present invention that is comprised of $ZnO_x/TaO_x$. The CoFeCu free magnetic layer of the present invention provides improved sensor performance characteristics of reduced coercivity and generally similar GMR as compared to the prior art. Where the $ZnO_x/TaO_x$ cap layer is utilized, increased GMR is obtained. Thus a magnetic head of the present invention that includes both a CoFeCu free magnetic layer and a $ZnO_x/TaO_x$ cap layer demonstrates reduced coercivity and increased GMR.

34 Claims, 4 Drawing Sheets

MAGNETIC HEAD SPIN VALVE STRUCTURE WITH COFECU MAGNETIC LAYER AND ZNO$_X$/TAO$_X$ CAP LAYER

BACKGROUND OF THE INVENTION

1. Field of the Invention

The present invention relates generally to spin valve sensors for magnetic heads, and more particularly to an improved free magnetic layer including CoFeCu for the spin valve sensor structure and a cap layers that includes oxides of zinc and tantalum.

2. Description of the Prior Art

Magnetic heads for hard disk drives typically have a read head portion including a magnetoresistive (MR) spin valve sensor structure for reading data from the disk of the hard disk drive. As is well known to those skilled in the art, such MR sensor structures include a plurality of thin film layers disposed between two magnetic shields that define the read gap. The thin film layers have particular magnetic properties, and are sensitive to the magnetic field of the data bits on the hard disk.

The thin film layers of a typical MR spin valve sensor will typically include at least one antiferromagnetic layer, at least one pinned magnetic layer, at least one free magnetic layer, and a cap layer. When reading data, a magnetic data bit of a hard disk will cause the direction of the magnetization of the free magnetic field layer to change, whereupon the electrical resistance of the sensor changes. This change in resistance ($\Delta R$) affects the electrical current passing through the sensor, which is thus detected as a data signal.

Recently developed read heads may alternatively use a tunnel junction sensor, also known as a "tunnel valve", abbreviated "TV", for reading the magnetic data bit signals from the hard disk. The TV sensor typically includes a nonmagnetic tunneling barrier layer sandwiched between a pinned magnetic layer and a free magnetic layer. The tunnel junction sensor is itself typically sandwiched between first and second magnetic shield layers that also serve as first and second electrical lead layers, and are connected to the tunnel junction sensor for conducting a tunneling current through it. The TV sensor is configured to conduct Current Perpendicular to the Plane (CPP) of the film layers of the sensor, as opposed to an MR sensor as described above where the sense current is Current In the Plane (CIP) or parallel to film layers of the spin valve sensor.

The free layer material is preferably a magnetically soft material with low coercivity, which is a measure of the minimum field strength necessary to make changes in the orientation of the magnetization of the free layer. The free layer material necessarily must have this quality, as it is this layer's changes in magnetic alignment in response to the magnetic data bits of the hard disk that leads to changes in resistance, which is how the data is read. Currently the free layer is composed of a CoFe or NiFe layer, or is a bilayer structure of CoFe and NiFe layers. These materials may easily fall into multidomain magnetic states, where alignment of magnetic domains is not uniform. It is desirable however that the magnetization of the free layer be biased to be uniform throughout the entire layer. If the free layer material assumes a multidomain state, the read signal will be degraded.

In prior art magnetoresistive sensor structures a cap layer is typically deposited on top of the free magnetic layer, and the cap layer is typically composed of tantalum. The cap layer can influence the magnetoresistive properties of the sensor and an improved cap layer, such as is presented herein, enhances the performance of the sensor.

SUMMARY OF THE INVENTION

A magnetic head of the present invention includes a spin valve sensor of the present invention which may be a CIP or CPP device. The sensor includes a free magnetic layer that is comprised of CoFeCu. In certain embodiments the free magnetic layer may also include a sublayer of NiFe. The CoFeCu free magnetic layer preferably includes Fe in a range of 5-20 at. % and Cu in a range of 1-10 at. %.

The sensor may also include a cap layer of the present invention that is comprised of ZnO$_x$/TaO$_x$. In preferred embodiments, the range of oxygen in the ZnO$_x$ is 40-55 at. % and the range of oxygen in the TaO$_x$ is 50-75 at %. The CoFeCu free magnetic layer of the present invention provides improved sensor performance characteristics of reduced coercivity and generally similar GMR as compared to the prior art. Where the ZnO$_x$/TaO$_x$ cap layer is utilized, increased GMR is obtained. Thus a magnetic head of the present invention that includes both a CoFeCu free magnetic layer and a ZnO$_x$/TaO$_x$ cap layer demonstrates reduced coercivity and increased GMR.

It is an advantage of the magnetic head of the present invention that it includes a magnetoresistive read head sensor having a decreased coercivity.

It is another advantage of the magnetic head of the present invention that it includes a magnetoresistive sensor having an increased $\Delta R/R$ and a reduced coercivity.

It is a further advantage of the magnetic head of the present invention that it includes a magnetoresistive sensor having a free magnetic layer that is comprised of CoFeCu.

It is yet another advantage of the magnetic head of the present invention that it includes a magnetoresistive sensor including an a cap layer that is comprised of ZnO$_x$/TaO$_x$.

It is an advantage of the hard disk drive of the present invention that it includes a magnetic head of the present invention having a magnetoresistive sensor having a decreased coercivity.

It is another advantage of the hard disk drive of the present invention that it includes a magnetic head of the present invention that includes a magnetoresistive sensor having an increased $\Delta R/R$ and a reduced coercivity.

It is a further advantage of the hard disk drive of the present invention that it includes a magnetic head of the present invention that includes a magnetoresistive sensor having a free magnetic layer that is comprised of CoFeCu.

It is yet another advantage of the hard disk drive of the present invention that it includes a magnetic head of the present invention that includes a magnetoresistive sensor including a cap layer that is comprised of ZnO$_x$/TaO$_x$.

The foregoing and other objects, features, and advantages of the present invention will be apparent from the following detailed description of the preferred embodiments which make reference to the several figures of the drawing.

IN THE DRAWINGS

The following drawings are not made to scale as an actual device, and are provided for illustration of the invention described herein.

Figure 5:
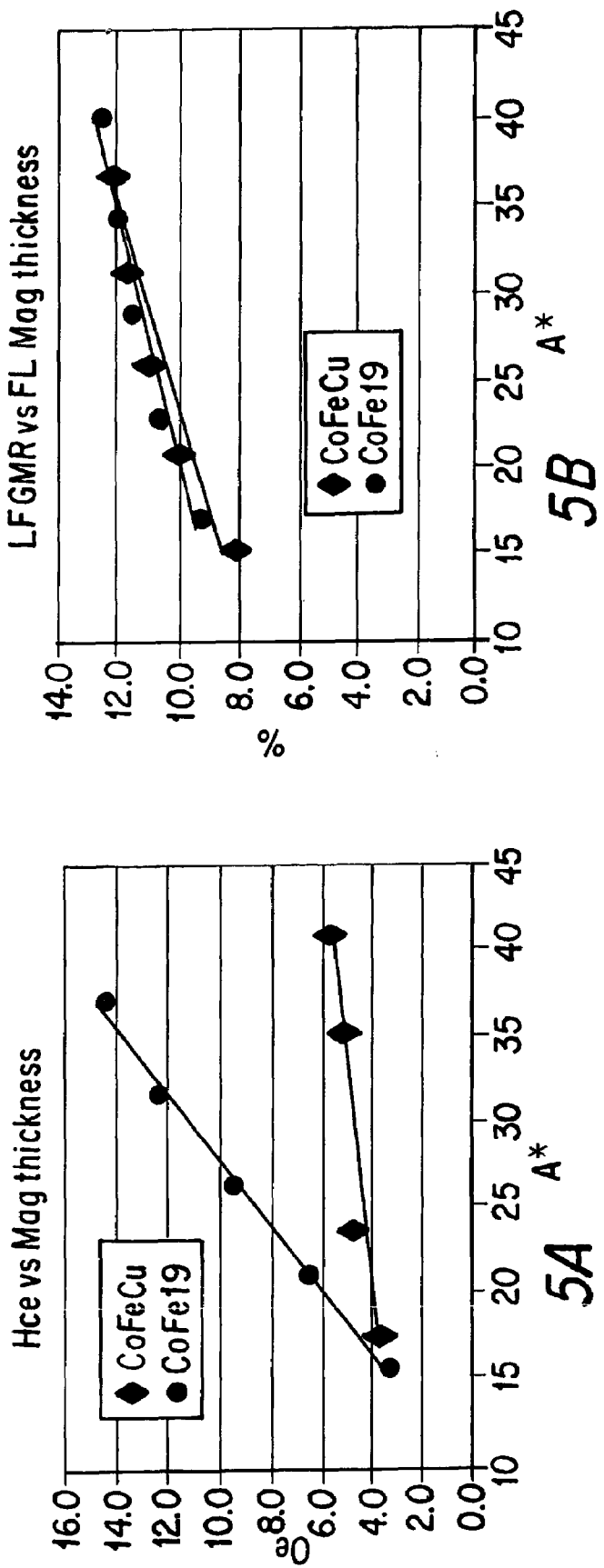
Figure 6:
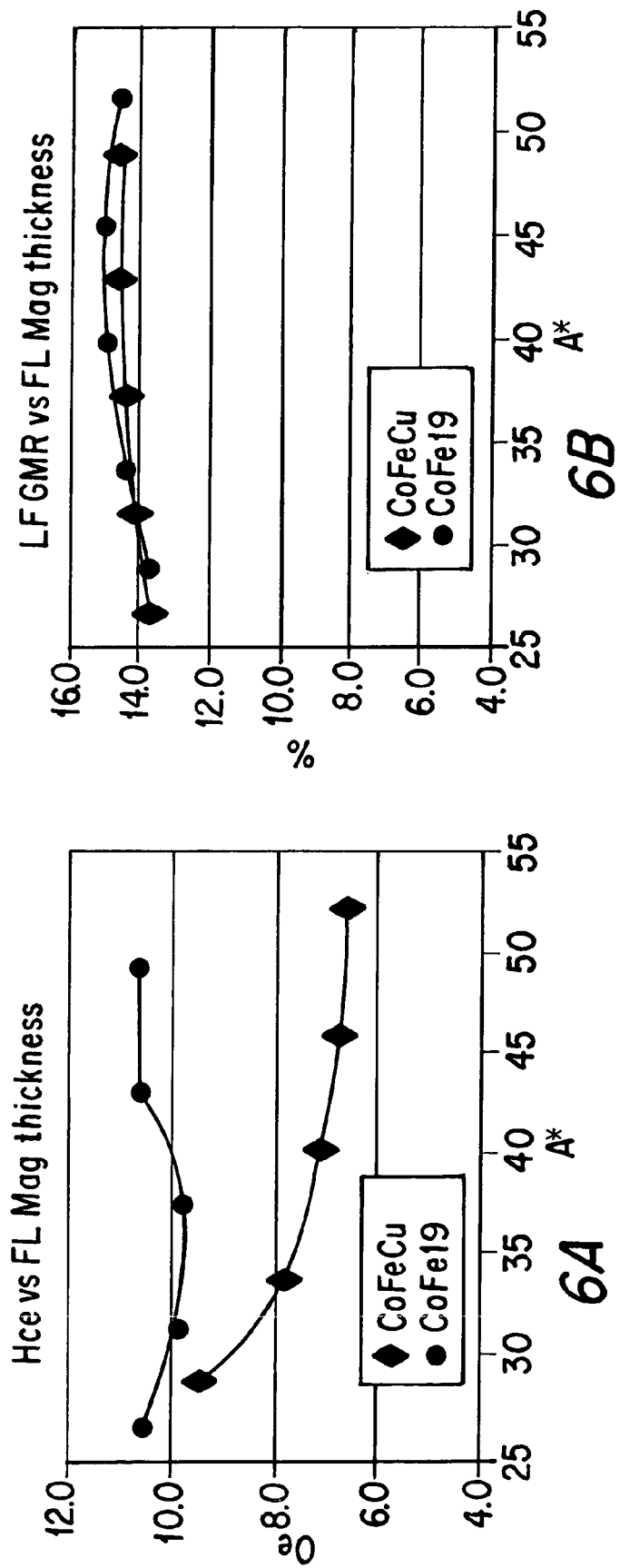

FIG. 5 is a figure including graphs 5A and 5B comparing the performance characteristics of the CoFeCu free magnetic layer of the present invention with a prior art CoFe free magnetic layer with a Ta cap layer; and FIG. 6 is a figure including graphs 6A and 6B comparing the performance characteristics of the CoFeCu free magnetic layer of the present invention with a prior art CoFe free magnetic layer with a $ZnO_x/TaO_x$ cap layer.

DETAILED DESCRIPTION OF THE PREFERRED EMBODIMENTS

Figure 1:
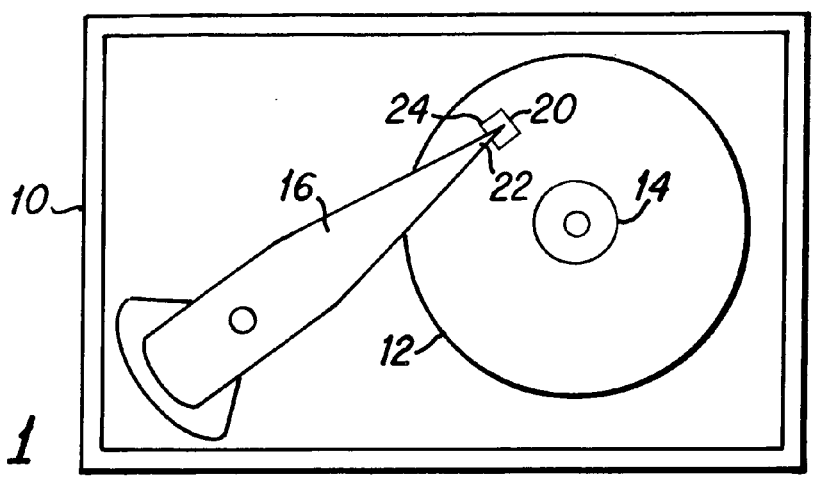
FIG. 1 is a top plan view generally depicting a hard disk drive that includes a magnetic head of the present invention.

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. A typical hard disk drive 10 may include a plurality of disks 12 that are rotatably mounted upon the spindle 14 and a plurality of actuator arms 16 having a magnetic head 20 mounted upon the distal end 22 of the actuator arms. As is well known to those skilled in the art, when the hard disk drive 10 is operated, the hard disk 12 rotates upon the spindle 14 and the magnetic head 20 acts as an air bearing slider that is adapted for flying above the surface of the rotating disk. The slider includes a substrate base upon which the various layers and structures that form the magnetic head are fabricated. Such heads are fabricated in large quantities upon a wafer substrate and subsequently sliced into discrete magnetic heads 20.

Figure 2:
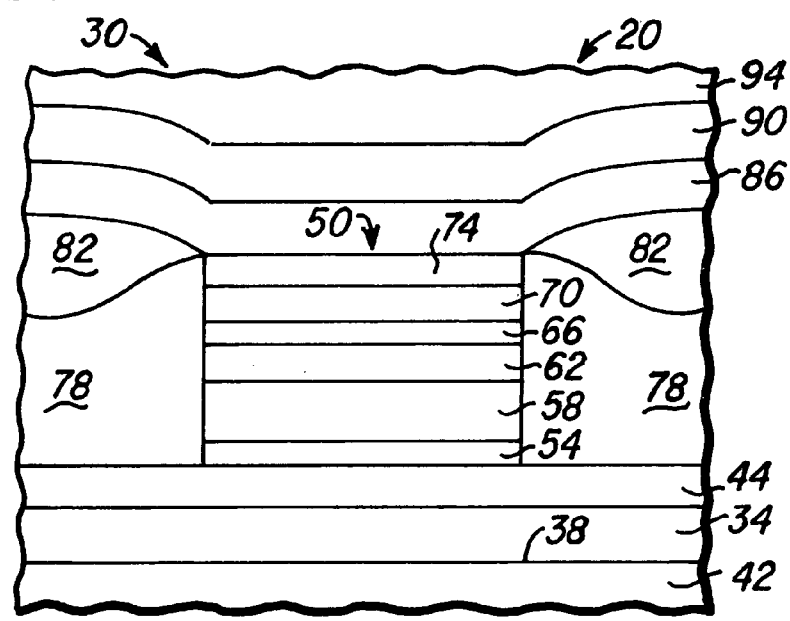
FIG. 2 is a front plan view depicting a typical CIP spin valve read head portion of a magnetic head as seen from the ABS.

A typical magnetic head 20 is fabricated to include a read head portion for reading data from the hard disk and a write head portion for writing to a hard disk, and FIG. 2 is a generalized depiction of a read head portion 30 of a magnetic head 20 which will serve as a starting point for the description of the novel read head features of the present invention that follow. As depicted in FIG. 2, the read head portion 30 includes a current-in-plane (CIP) spin valve sensor that includes a first magnetic shield layer (S1) 34 that is fabricated upon the surface 38 of a substrate base 42. A first insulation layer (G1) 44 is fabricated upon the S1 shield 34 and a plurality of read head sensor layers 50 are then fabricated upon the G1 layer 44. The sequence of sensor layers in the spin valve layer structure 50 may include a seed layer 54 such as $AlO_x/NiFeCr/NiFe$, a PtMn layer that acts as an antiferromagnetic layer 58, a CoFe/Ru/CoFe pinned magnetic layer structure 62, a Cu layer that acts as a spacer layer 66, a free magnetic layer 70, and a cap layer 74. Using photolithographic and etching techniques, outer portions of the sensor layers are removed such that the central portions 50 depicted in FIG. 2 remain. Thereafter, magnetic hard bias elements 78 are fabricated next to the sensor layers 50, electrical leads 82 are fabricated upon the hard bias elements 78, a second electrical insulation layer (G2) 86 is deposited across the device followed by the fabrication of a second magnetic shield (S2) 90, and a write head portion (generally indicated as 94) is subsequently fabricated to complete the magnetic head fabrication process.

Figure 3:
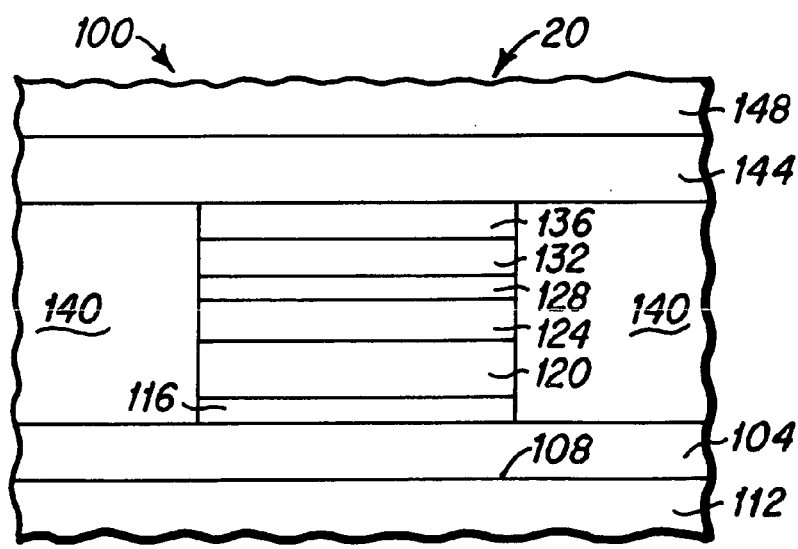
FIG. 3 is a front plan view of the structure of a typical CPP tunnel valve read sensor portion of a magnetic head as seen from the ABS.

In contrast, FIG. 3 depicts a typical tunnel valve MR sensor 100 of a magnetic head 20 that is a Current-Perpendicular-to-Plane (CPP) device. In this configuration, it is necessary that current is not blocked by an insulation layer, such as the G1 and G2 layers seen in the CIP sensor configuration of FIG. 2. As depicted in FIG. 3, the typical tunnel valve sensor includes a first magnetic shield layer 104 that is fabricated upon the surface 108 of a substrate base 112. A seed layer 116 such as NiFeCr/NiFe is deposited upon the magnetic shield 104, followed by a PtMn antiferromagnetic layer 120 that is deposited upon the seed layer 116. A pinned magnetic layer structure 124 such as CoFe/Ru/CoFe is deposited upon the antiferromagnetic layer 120 and an insulative tunnel valve layer 128 that is composed of a material such as alumina is deposited upon the pinned magnetic layer 124. A free magnetic layer 132 is deposited above the alumina layer 128 and a cap layer 136 is deposited upon the free magnetic layer 132. Using photolithographic and etching techniques, outer portions of the sensor layers are removed such that the central portions depicted in FIG. 3 remain. Thereafter, an electrically insulative material 140, such as alumina, is fabricated next to the sensor layers and a second magnetic shield 144 is then deposited. The first and second magnetic shield layers are electrically connected to act as electrical leads for the sensor where the electrical current through the sensor is perpendicular to the plane of the sensor layers. Further write head structures (generally indicated as 148) are subsequently fabricated to complete the magnetic head.

Magnetoresistive spin valve sensors, such as are depicted in FIGS. 2 and 3 and described herein, operate by detecting magnetic data bits written upon the hard disk 12 through a change in electrical resistance within the sensor when the sensor is exposed to the magnetic field of the data bit. Specifically, the orientation of the free layer magnetization is altered by the magnetic field of a data bit, and the change in the orientation of the free layer magnetization creates a change in the electrical resistance of the sensor. This change in resistance is generally designated as $\Delta R$, where R is the sensor resistance when the free layer magnetic field is in the quiescent state, and $\Delta R$ is the change in resistance of the sensor when the free layer magnetic field is altered by the presence of magnetic data bits of the hard disk. The value $\Delta R/R$ may be referred to as the GMR, and it basically is a representation of the percentage change in the sensor resistance, and it is utilized in comparing the qualities of spin valve sensors.

Another significant performance parameter for an MR sensor is the magnetic coercivity of the free magnetic layer, because the coercivity is a measure of the stability of the layer, and the lower the coercivity of the layer, the more stable it is. Therefore, it is a performance goal for the sensor of the present invention to have a free layer having a higher GMR and lower coercivity. As will appear from the following description, the improved free magnetic layer of the present invention results in the creation of sensors having a reduced coercivity. An improved sensor of the magnetic head of the present invention can include an improved cap layer (74 or 136), as is described in detail herebelow, resulting in a magnetic head having a reduced free magnetic layer coercivity and an improved GMR.

In a typical prior art magnetoresistive sensor, whether a CIP or CPP sensor, the free magnetic layer is composed of a CoFe layer, or is fabricated as a two layer structure having a first CoFe layer and a second NiFe layer. It is necessary that the free layer magnetization be able to rapidly change direction in response to the change in direction of the magnetic data fields that it is reading from the data medium. To accomplish this, it is important that the free layer not be allowed to assume a multi-domain magnetic state where the alignment of magnetic domains is not uniform. The prior art CoFe free magnetic layer material has a tendency to do this. If the free layer material is allowed to assume a multidomain state, the read signal will be degraded. The free layer material is therefore preferably a magnetically soft material with low coercivity.

In the present invention, the free magnetic layer 70 or 132 is comprised of at least one layer of CoFeCu. The addition of copper to the prior art CoFe free magnetic layer material acts to reduce the coercivity of the layer material while not reducing its resistivity. As a result, a free magnetic layer of the present invention may be fabricated with a thickness that may be less than or approximately equal to the thickness of the prior art CoFe layer, where the CoFeCu free magnetic layer of the present invention has a reduced coercivity and similar GMR of the prior art free magnetic layer. Additionally, the inclusion of copper within the CoFeCu free magnetic layer material allows for an increase in the amount of Fe in the free magnetic layer. This added Fe softens the free magnetic layer; that is, reduces its coercivity, which leads to the enhanced performance characteristics of the sensor that includes the CoFeCu free magnetic layer. Also, if the free magnetic layer is fabricated as a two layer structure, where one layer is CoFeCu and the second layer is NiFe, a free magnetic layer and MR sensor having further enhanced performance characteristics is obtained. Where the prior art CoFe free magnetic layer typically has approximately 10 at. % Fe, the CoFeCu free magnetic layer of the present invention may include Cu in a range of 1-10 at. % with Fe in a range of 5-20 at. %. A preferred CoFeCu free magnetic layer (70 or 132) is Co-15.4 Fe-4 Cu.

An additional feature of the present invention is an alteration of the material that forms the cap layer (74 or 136) of the MR sensor. As indicated hereabove, the prior art cap is typically comprised of tantalum. It has been determined by the inventors herein, that a cap layer that is comprised of oxides of zinc and tantalum ($ZnO_x/TaO_x$) provides further enhanced performance characteristics by the increasing the magnetic resistance (GMR) of the free magnetic layer and therefore the MR sensor. It is believed that the change in resistivity of the free magnetic layer is a result of altering the boundary conditions between the free magnetic layer and the $ZnO_x/TaO_x$ cap layer, such that the scattering of electrons within the free magnetic layer is altered at the boundary between the free magnetic layer and the cap layer. A preferred cap layer 74 or 136 has a $ZnO_x$ sublayer thickness of approximately 3 to 50 Å and a $TaO_x$ sublayer thickness of approximately 4 t 70 Å. The oxygen range of the $ZnO_x$ is approximately 40-55 at. %, with a preferred stoichiometric ZnO cap having 50 at. % oxygen, and the oxygen range of the $TaO_x$ is approximately 50-75 at. %, with a preferred stoichiometric $Ta_2O_5$ cap having approximately 71 at. % oxygen.

To demonstrate the improved performance characteristics of the present invention three specific MR sensors are next described with graphical data of their performance characteristics.

Figure 4:
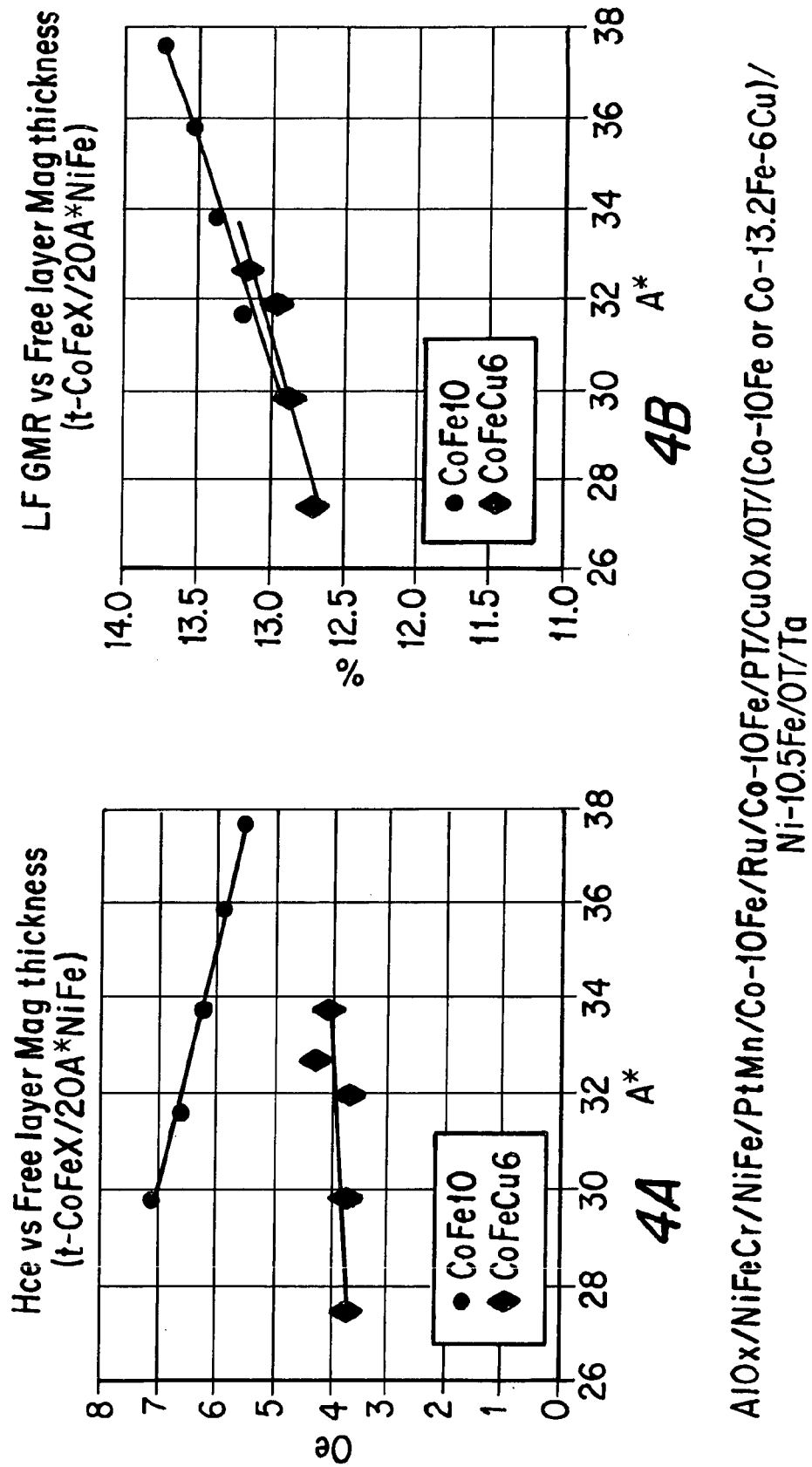
FIG. 4 is a figure including graphs 4A and 4B comparing the performance characteristics of CoFeCu/NiFe free magnetic layer of the present invention with a prior art CoFe/NiFe free magnetic layer with a Ta cap layer.

FIG. 4 presents data of an MR sensor of the present invention having a Co-13.2 Fe-6 Cu/Ni-10.5 Fe free magnetic layer as compared to a prior art MR sensor having a Co-10 Fe/Ni-10.5 Fe free magnetic layer, each having a Ta cap. FIG. 4A demonstrates that the easy access coercivity of the MR sensor having the CoFeCu free magnetic layer is lower than that of the prior art CoFe free magnetic layer for all thicknesses of the free magnetic layer. FIG. 4B demonstrates that the GMR of the CoFeCu free magnetic layer approximately equal to the GMR of the CoFe free magnetic layer of the prior art.

FIG. 5 presents data that compares an MR sensor of the present invention having a Co-15.4 Fe-4 Cu free magnetic layer as compared to a MR sensor having a Co-19 Fe free magnetic layer, where each device has a tantalum cap. As depicted in FIG. 5A, the MR sensor of the present invention having a CoFeCu free magnetic layer has a coercivity that is generally lower than the coercivity of the CoFe free magnetic layer for practically all thicknesses of the free magnetic layer. As depicted in FIG. 5B, the GMR of the CoFeCu free magnetic layer of the present invention is generally approximately equal to the GMR of the CoFe free magnetic layer.

FIG. 6 presents data that reflects the effects of the cap layer of the present invention; that is, the $ZnO_x/TaO_x$ cap layer. Specifically, FIG. 6 presents data for a free magnetic layer of the present invention having a Co-15.4 Fe-4 Cu free magnetic layer as compared to a Co-19 Fe free magnetic layer, each having a $ZnO_x/TaO_x$ cap of the present invention. As depicted in FIG. 5A, the MR head having a CoFeCu free magnetic layer continues to have a lower coercivity than the CoFe free magnetic layer for all thicknesses of the free magnetic layer. FIG. 6B shows that the GMR of the CoFeCu free magnetic layer of the present invention is approximately equal to the GMR of the CoFe free magnetic layer. Significantly, when comparing the GMR of the devices of FIG. 6, whether using a CoFeCu free magnetic layer of the present invention or a CoFe free magnetic layer, it is seen that the GMR is generally higher than the GMR of the MR sensors of FIG. 4 or 5. This means that the $ZnO_x/TaO_x$ cap layer of the present invention generally produces a desirable higher GMR than sensors having a prior art Ta cap layer.

It is therefore the case that a magnetic head of the present invention that includes a CoFeCu free magnetic layer of the present invention provides superior performance characteristics of reduced coercivity. Additionally, a magnetic head of the present invention that includes a $ZnO_x/TaO_x$ cap layer provides enhanced performance characteristics of increased GMR over those of the prior art. A magnetic head of the present invention that includes a CoFeCu free magnetic layer and a $ZnO_x/TaO_x$ cap layer provides a desirable reduced coercivity as well as increased GMR over the prior art devices.

While the present invention has been shown and described with regard to certain preferred embodiments, it is to be understood that those skilled in the art will no doubt develop certain alterations and modifications in form and detail therein. It is therefore intended that the following claims cover all such alterations and modifications that nevertheless include the true spirit and scope of the present invention.

We claim:

1. A magnetic head including a magnetic read sensor comprising:
    a sensor structure including a plurality of thin film layers, including a free magnetic layer that is comprised of CoFeCu, and wherein said free magnetic layer farther includes a NiFe sublayer.

2. A magnetic head as described in claim 1 wherein said CoFeCu free magnetic layer includes Fe in a range of 5-20 at. % and Cu in a range of 1-10 at. %.

3. A magnetic head as described in claim 2 wherein said sensor structure includes a cap layer comprised of $ZnO_x/TaO_x$.

4. A magnetic head as described in claim 1 wherein said sensor structure further includes a cap layer comprised of $ZnO_x/TaO_x$.

5. A magnetic head as described in claim 4 wherein said $ZnO_x$ includes oxygen in the range of 40-55 at. %.

6. A magnetic head as described in claim 4 wherein said $TaO_x$ includes oxygen in the range of 50-75 at. %.

7. A magnetic head including a magnetic read sensor comprising:
a sensor structure including a cap layer comprised of $ZnO_x/TaO_x$.

8. A magnetic head as described in claim 7 wherein said $ZnO_x$ includes oxygen in the range of 40-55 at. %.

9. A magnetic head as described in claim 7 wherein said $TaO_x$ includes oxygen in the range of 50-75 at. %.

10. A magnetic head as described in claim 7 wherein said sensor structure further includes a free magnetic layer that is comprised of CoFeCu.

11. A magnetic head including a spin valve sensor comprising:
a magnetic shield layer (S1) being fabricated above a substrate base;
a first electrical insulation layer (G1) being fabricated above said S1 layer;
a spin valve sensor structure being disposed above said G1 layer;
wherein said spin valve sensor structure includes a free magnetic layer that is comprised of CoFeCu.

12. A magnetic head as described in claim 11 wherein said free magnetic layer further includes a NiFe sublayer.

13. A magnetic head as described in claim 11 wherein said CoFeCu free magnetic layer includes Fe in a range of 5-20 at. % and Cu in a range of 1-10 at. %.

14. A magnetic head as described in claim 13 wherein said free magnetic layer further includes an NiFe sublayer.

15. A magnetic head as described in claim 13 wherein said sensor structure includes a cap layer comprised of $ZnO_x/TaO_x$.

16. A magnetic head as described in claim 11 wherein said sensor structure further includes a cap layer comprised of $ZnO_x/TaO_x$.

17. A magnetic head including a tunnel valve sensor comprising:
a magnetic shield layer (S1) being fabricated above a substrate base;
a tunnel valve sensor structure being disposed above said S1 layer;
wherein said tunnel valve sensor structure includes a free magnetic layer that is comprised of CoFeCu.

18. A magnetic head as described in claim 17 wherein said free magnetic layer further includes a NiFe sublayer.

19. A magnetic head as described in claim 17 wherein said CoFeCu free magnetic layer includes Fe in a range of 5-20 at. % and Cu in a range of 1-10 at. %.

20. A magnetic head as described in claim 19 wherein said free magnetic layer further includes an NiFe sublayer.

21. A magnetic head as described in claim 19 wherein said sensor structure includes a cap layer comprised of $ZnO_x/TaO_x$.

22. A magnetic head as described in claim 17 wherein said sensor structure further includes a cap layer comprised of $ZnO_x/TaO_x$.

23. A hard disk drive, including at least one magnetic head having a read head portion comprising:
a magnetic shield layer (S1) being fabricated above a substrate base;
a first electrical insulation layer (G1) being fabricated above said S1 layer;
a spin valve sensor structure being disposed above said G1 layer;
wherein said spin valve sensor structure includes a free magnetic layer that is comprised of CoFeCu.

24. A hard disk drive as described in claim 23 wherein said free magnetic layer further includes a NiFe sublayer.

25. A hard disk drive as described in claim 23 wherein said CoFeCu free magnetic layer includes Fe in a range of 5-20 at. % and Cu in a range of 1-10 at. %.

26. A hard disk drive as described in claim 25 wherein said free magnetic layer further includes an NiFe sublayer.

27. A hard disk drive as described in claim 25 wherein said sensor structure includes a cap layer comprised of $ZnO_x/TaO_x$.

28. A hard disk drive as described in claim 23 wherein said sensor structure further includes a cap layer comprised of $ZnO_x/TaO_x$.

29. A hard disk drive, including at least one magnetic head having a read head portion comprising:
a magnetic shield layer (S1) being fabricated above a substrate base;
a tunnel valve sensor structure being disposed above said S1 layer;
wherein said tunnel valve sensor structure includes a free magnetic layer that is comprised of CoFeCu.

30. A hard disk drive as described in claim 29 wherein said free magnetic layer further includes a NiFe sublayer.

31. A hard disk drive as described in claim 29 wherein said CoFeCu free magnetic layer includes Fe in a range of 5-20 at. % and Cu in a range of 1-10 at. %.

32. A hard disk drive as described in claim 31 wherein said free magnetic layer further includes an NiFe sublayer.

33. A hard disk drive as described in claim 31 wherein said sensor structure includes a cap layer comprised of $ZnO_x/TaO_x$.

34. A hard disk drive as described in claim 29 wherein said sensor structure further includes a cap layer comprised of $ZnO_x/TaO_x$.

* * * * *